US012584238B2

(12) United States Patent
Lin

(10) Patent No.: US 12,584,238 B2
(45) Date of Patent: Mar. 24, 2026

(54) SILICON CARBIDE CRYSTALS AND SILICON CARBIDE WAFER

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 480 days.

(21) Appl. No.: 18/344,873

(22) Filed: Jun. 30, 2023

(65) Prior Publication Data

US 2024/0011190 A1 Jan. 11, 2024

Related U.S. Application Data

(60) Provisional application No. 63/359,205, filed on Jul. 8, 2022, provisional application No. 63/359,203, filed on Jul. 8, 2022, provisional application No. 63/359,208, filed on Jul. 8, 2022.

(51) Int. Cl.
| | |
|---|---|
| *C30B 23/00* | (2006.01) |
| *C30B 25/10* | (2006.01) |
| *C30B 25/16* | (2006.01) |
| *C30B 29/36* | (2006.01) |

(52) U.S. Cl.
CPC ............ *C30B 23/002* (2013.01); *C30B 25/10* (2013.01); *C30B 25/165* (2013.01); *C30B 29/36* (2013.01)

(58) Field of Classification Search
None
See application file for complete search history.

(56) References Cited

U.S. PATENT DOCUMENTS

| | | | |
|---|---|---|---|
| 6,428,621 | B1 | 8/2002 | Vodakov et al. |
| 7,422,634 | B2 | 9/2008 | Powell et al. |
| 9,287,121 | B2 | 3/2016 | Momose et al. |
| 10,283,402 | B2 * | 5/2019 | Wang ................ H01L 21/02532 |
| 2002/0023581 | A1 | 2/2002 | Vodakov et al. |
| 2006/0118037 | A1 | 6/2006 | Powell et al. |
| 2012/0241766 | A1 | 9/2012 | Ohtsuka et al. |
| 2014/0318442 | A1 * | 10/2014 | Sivaramakrishnan ...................... C30B 25/105 |
| | | | 118/725 |
| 2016/0138186 | A1 | 5/2016 | Hori et al. |
| 2016/0236375 | A1 | 8/2016 | Hori et al. |

| | | | |
|---|---|---|---|
| 2019/0106807 | A1 | 4/2019 | Lin et al. |
| 2019/0106811 | A1 | 4/2019 | Lin et al. |
| 2021/0198804 | A1 | 7/2021 | Khlebnikov et al. |
| 2024/0011185 | A1 | 1/2024 | Lin |

FOREIGN PATENT DOCUMENTS

| | | | |
|---|---|---|---|
| CN | 105671638 | | 6/2016 |
| CN | 104813439 | | 4/2017 |
| CN | 104246023 | | 2/2019 |
| CN | 107532327 | | 12/2019 |
| CN | 106716596 | | 11/2020 |
| CN | 112430845 | | 3/2021 |
| CN | 214300468 U | * | 9/2021 |
| JP | 2003523918 | | 8/2003 |
| JP | 2005239465 | | 9/2005 |
| JP | 2012250888 | | 12/2012 |
| JP | 2015086114 | | 5/2015 |
| JP | 2015229623 | | 12/2015 |
| JP | 2021031332 | | 3/2021 |
| TW | I663297 | | 6/2019 |
| TW | 202204256 | | 2/2022 |
| WO | 2021044907 | | 3/2021 |

OTHER PUBLICATIONS

CN-214300468-U—English translation (Year: 2021).*
"Office Action of U.S. Related Application, U.S. Appl. No. 18/344,863", issued on May 16, 2025, p. 1-p. 36.
"Office Action of U.S. Related Application, U.S. Appl. No. 18/344,875", issued on May 22, 2025, p. 1-p. 41.
"Office Action of related U.S. Application, U.S. Appl. No. 18/344,875", issued on Sep. 16, 2025, p. 1-p. 17.
"Office Action of Taiwan Related Application, Application No. 112124538", issued on May 14, 2024, p. 1-p. 7.
"Office Action of Japan Related Application, Application No. 2023107873", issued on Feb. 26, 2025, p. 1-p. 5.
"Office Action of Japan Related Application, Application No. 2023107612", issued on Aug. 23, 2024, p. 1-p. 3.
"Office Action of Japan Related Application, Application No. 2023107873", issued on Oct. 21, 2024, p. 1-p. 6.
"Office Action of Taiwan Counterpart Application", issued on Feb. 21, 2024, p. 1-p. 8.
"Office Action of Taiwan Related Application, Application No. 112124540", issued on Feb. 22, 2024, p. 1-p. 5.

* cited by examiner

*Primary Examiner* — Stefanie J Cohen

(74) *Attorney, Agent, or Firm* — JCIPRNET

(57) ABSTRACT

A silicon carbide crystal and a silicon carbide wafer, wherein a monocrystalline proportion of the silicon carbide crystal and the silicon carbide wafer is 100%, the resistivity thereof is in a range of 15 mΩ·cm to 20 mΩ·cm, and a deviation of an uniformity of the resistivity thereof is less than 0.4%.

12 Claims, 6 Drawing Sheets

Example 1

Example 2

Example 3

Example 4

SILICON CARBIDE CRYSTALS AND SILICON CARBIDE WAFER

CROSS-REFERENCE TO RELATED APPLICATION

This application claims the priority benefits of U.S. provisional application Ser. No. 63/359,203, filed on Jul. 8, 2022, U.S. provisional application Ser. No. 63/359,205, filed on Jul. 8, 2022, and U.S. provisional application Ser. No. 63/359,208, filed on Jul. 8, 2022. The entirety of the above-mentioned patent application is hereby incorporated by reference herein and made a part of this specification.

BACKGROUND

Technical Field

The present disclosure relates to silicon carbide crystals and silicon carbide wafer.

Description of Related Art

At present, silicon wafers have been widely used in the semiconductor industry. Many electronic devices contain silicon wafers produced using silicon wafers as materials. However, in order to improve wafer performance, many manufacturers have attempted to use silicon carbide wafers as materials for producing silicon carbide chips. Silicon carbide wafers have the advantages of high temperature resistance and high stability.

As far as the prior art is concerned, when growing N-type silicon carbide crystals, a common method is to increase a nitrogen doping concentration, so that the resistivity can be lowered, which will be better for downstream components, and the electrical performance will also be improved. However, high doping concentration is likely to cause an increase in basal plane dislocations (BPD) and bar stacking faults (BSF), the industry generally avoids the use of high doping during crystal growth, which in turn results in a high resistivity and poor uniformity of the resistivity. If the silicon carbide crystal has a uniform resistance distribution, the crystal stress can be reduced, and the geometry of the processed wafer will also be improved. In addition, the electrical properties and performance of a silicon carbide device fabricated therefrom will also be improved. Based on the above, how to produce silicon carbide crystals and wafers with uniform resistivity is a problem to be solved.

SUMMARY

The present disclosure provides a silicon carbide crystal and a silicon carbide wafer, and by controlling a ratio difference between an axial temperature gradient and a radial temperature gradient of the silicon carbide crystal and adjusting the doping amount of the nitrogen concentration, the formed silicon carbide crystal and silicon carbide wafer will have uniform resistivity.

The present disclosure provides a silicon carbide crystal, wherein a monocrystalline proportion of the silicon carbide crystal is 100%, a resistivity of the silicon carbide crystal is in a range of 15 m$\Omega$·cm to 20 m$\Omega$·cm, and a deviation of an uniformity of the resistivity of the silicon carbide crystal is less than 0.4%.

In one embodiment of the present disclosure, the monocrystalline proportion of the silicon carbide crystal is 100%, a resistivity of the silicon carbide crystal is in a range of 19 m$\Omega$·cm to 20 m$\Omega$·cm, and a deviation of an uniformity of the resistivity of the silicon carbide crystal is less than 0.4%.

In one embodiment of the present disclosure, the deviation of the uniformity of the resistivity is less than 0.01%.

In one embodiment of the present disclosure, basal plane dislocations (BPD) of the silicon carbide crystal is less than 200/cm$^2$.

In one embodiment of the present disclosure, basal plane dislocations (BPD) of the silicon carbide crystal is less than 140/cm$^2$.

In one embodiment of the present disclosure, a bar stacking fault (BSF) of the silicon carbide crystal is less than 5/wafer.

The present disclosure provides a silicon carbide wafer, wherein a monocrystalline proportion of the silicon carbide wafer is 100%, a resistivity of the silicon carbide wafer is in a range of 15 m$\Omega$·cm to 20 m$\Omega$·cm, and a deviation of an uniformity of the resistivity of the silicon carbide wafer is less than 0.4%.

In one embodiment of the present disclosure, the monocrystalline proportion of the silicon carbide wafer is 100%, a resistivity of the silicon carbide wafer is in a range of 19 m$\Omega$·cm to 20 m$\Omega$·cm, and a deviation of an uniformity of the resistivity of the silicon carbide wafer is less than 0.4%.

In one embodiment of the present disclosure, the deviation of the uniformity of the resistivity is less than 0.01%.

In one embodiment of the present disclosure, basal plane dislocations (BPD) of the silicon carbide wafer is less than 200/cm$^2$.

In one embodiment of the present disclosure, basal plane dislocations (BPD) of the silicon carbide wafer is less than 140/cm$^2$.

In one embodiment of the present disclosure, a bar stacking fault (BSF) of the silicon carbide wafer is less than 5/wafer.

Based on the above, the N-type silicon carbide wafer formed by the method of growing silicon carbide crystals of the embodiments of the present disclosure can have a uniform resistivity distribution. Accordingly, the silicon carbide wafer obtained after the processing steps can have a lower wafer stress, and a wafer geometry can also be improved after processing.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
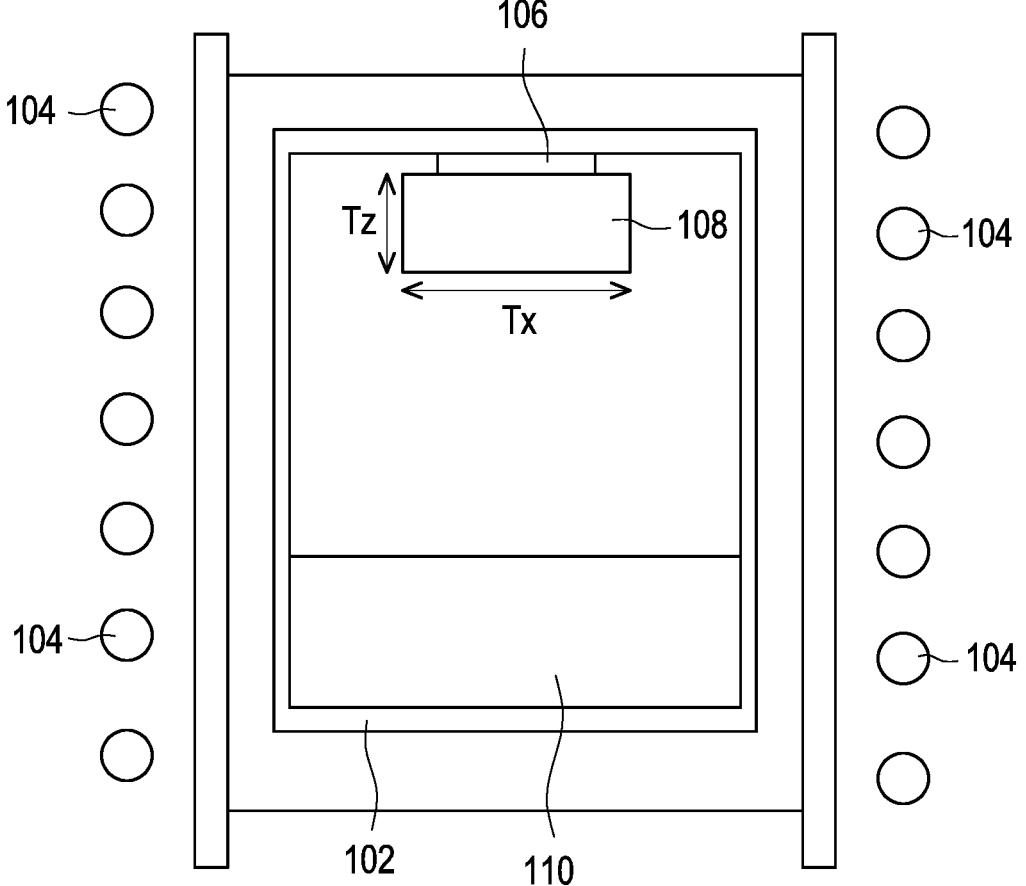
FIG. 1 is a schematic diagram of a crystal growth device according to an embodiment of the present disclosure.
Figure 2:
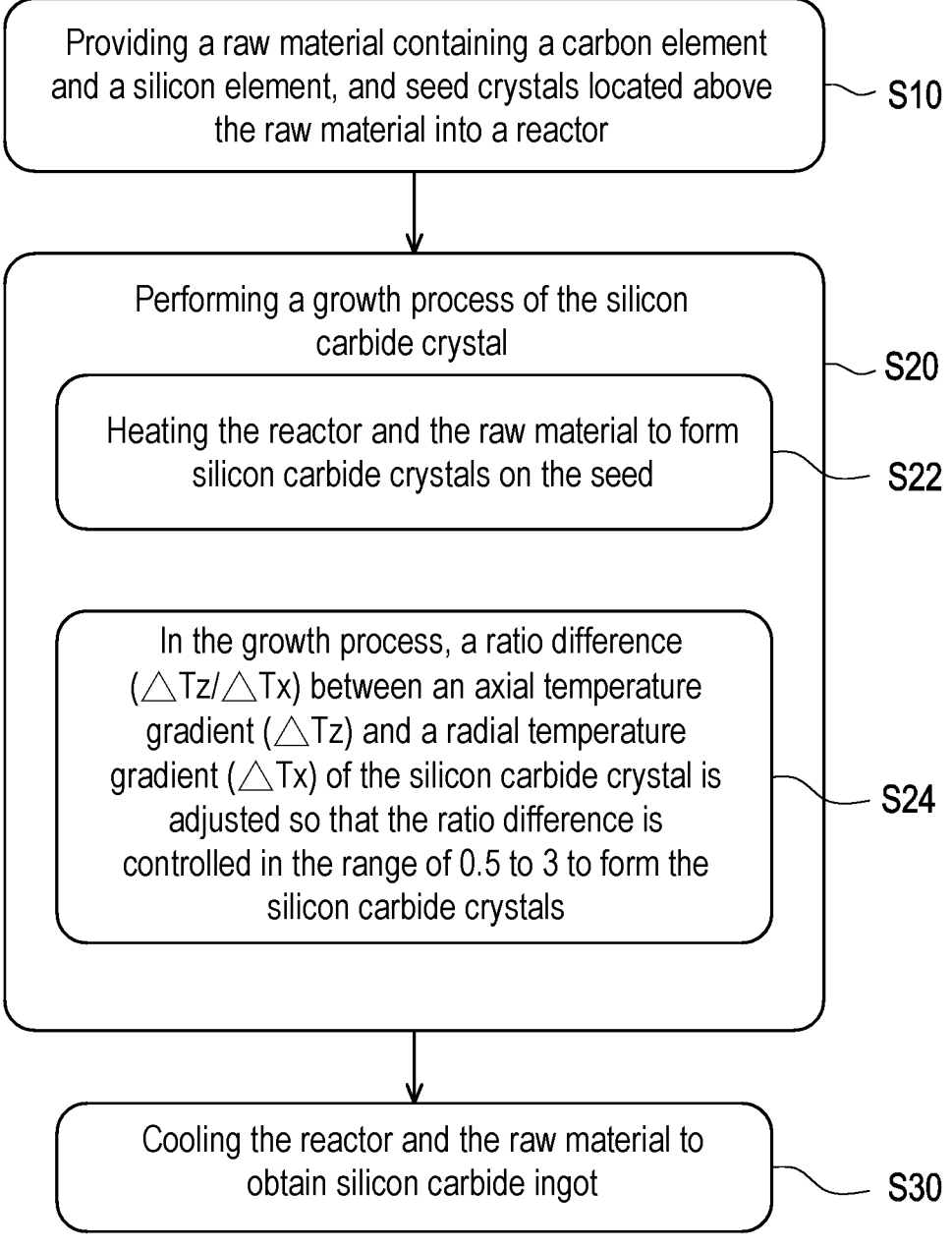
FIG. 2 is a flowchart of a method of growing silicon carbide crystals according to an embodiment of the present disclosure.

FIG. 1 is a schematic diagram of a crystal growth device according to an embodiment of the present disclosure. FIG. 2 is a flowchart of a method of growing silicon carbide crystals according to an embodiment of the present disclosure. Hereinafter, a method of growing silicon carbide crystals according to some embodiments of the present disclosure will be described with reference to the crystal growth device shown in FIG. 1 and the flow chart shown in FIG. 2.

As shown in FIG. 1 and step S10 of FIG. 2, in the crystal growth process, a raw material 110 including a carbon element and a silicon element, and a seed crystal 106 above the raw material 110 are provided into the reactor 102. For example, the raw material 110 is silicon carbide powder, which is placed at a bottom section of the reactor 102 and used as a solid sublimation source. The seed crystal 106 is placed on a top section of the reactor 102. In some embodiments, the seed crystal 106 can be fixed on a seed crystal loading platform (not shown) by an adhesive layer. The material of the seed crystal 106 includes silicon carbide. For example, the seed crystal 106 is 6H silicon carbide or 4H silicon carbide. In other embodiments, the seed crystal 106 includes 6H silicon carbide and 4H silicon carbide.

As shown in FIG. 1 and step S20 of FIG. 2, in some embodiments, a silicon carbide growth process is performed to form the silicon carbide crystal 108. For example, the growth process further includes performing step S22 and step S24. In step S22, the reactor 102 and the raw material 110 are heated to form silicon carbide crystals 108 on the seed crystals 106. In step S24 of the above growth process, a ratio difference ($\Delta Tz/\Delta Tx$) of an axial temperature gradient ($\Delta Tz$) and a radial temperature gradient ($\Delta Tx$) of the silicon carbide crystal 108 is adjusted so that the ratio difference is controlled in the range of 0.5 to 3 to form the silicon carbide crystal.

In the above step S22 and step S24, the silicon carbide crystal 108 is formed on the seed crystal 106 by physical vapor transport (PVT). In some embodiments, the reactor 102 and the raw material 110 are heated by the induction coil 104 to form the silicon carbide crystal 108 on the seed crystal 106. During the manufacturing process, the seed crystal 106 receives the raw material 110 (silicon carbide powder) that is solidified from a gaseous state, and slowly forms semiconductor crystals on the seed crystal 106 until the silicon carbide crystal 108 with the desired size is obtained. Subsequently, referring to FIG. 1 and step S30 of FIG. 2, after the silicon carbide crystal 108 is grown to a desired size, the reactor 102 and the raw material 110 are cooled to obtain a silicon carbide ingot composed of the silicon carbide crystal 108. In some embodiments, the ingots formed may have different crystalline structures depending on the orientation of the monocrystalline crystal seed used. For example, silicon carbide ingots include 4H-silicon carbide, 6H-silicon carbide, and the like. Both 4H-silicon carbide and 6H-silicon carbide belong to the hexagonal crystal system.

In the above-mentioned embodiment, when the reactor 102 and the raw material 110 are heated to form the silicon carbide crystal 108, the axial temperature gradient ($\Delta Tz$) refers to the temperature gradient of the silicon carbide crystal 108 in the thickness direction, while the radial temperature gradient ($\Delta Tx$) refers to the temperature gradient of the silicon carbide crystal 108 in a horizontal direction perpendicular to the thickness direction. In some embodiments, the growth rate difference of each crystal direction is utilized to adjust a temperature difference to achieve the ratio difference ($\Delta Tz/\Delta Tx$) in the range of 0.5 to 3. In general, a growth rate of the <11-20> crystal orientation is greater than a growth rate of the <1-100> crystal orientation. In the embodiment of the present disclosure, the growth rates of the two crystal orientations are controlled to be the same, so that the crystals in each axial/radial direction can obtain a certain growth rate for adjusting the ratio difference ($\Delta Tz/\Delta Tx$) to be in the range of 0.5 and 3.

In some embodiments, the ratio difference ($\Delta Tz/\Delta Tx$) of the axial temperature gradient ($\Delta Tz$) and the radial temperature gradient ($\Delta Tx$) is controlled in the range of 0.5 to 3 to form the silicon carbide crystal 108. In some embodiments, the ratio difference ($\Delta Tz/\Delta Tx$) of the axial temperature gradient ($\Delta Tz$) and the radial temperature gradient ($\Delta Tx$) is controlled in the range of 2 to 3 to form the silicon carbide crystal 108. In some embodiments, the ratio difference ($\Delta Tz/\Delta Tx$) of the axial temperature gradient ($\Delta Tz$) and the radial temperature gradient ($\Delta Tx$) is controlled in the range of 2.5 to 3 to form the silicon carbide crystal 108. In cases where the ratio difference ($\Delta Tz/\Delta Tx$) between the axial temperature gradient ($\Delta Tz$) and the radial temperature gradient ($\Delta Tx$) are controlled within the above range, the formed silicon carbide crystal 108 can have improved uniformity of the resistivity.

In some embodiments, when the reactor 102 and the raw material 110 are heated to form the silicon carbide crystal 108, that is, during the growth process of the silicon carbide crystal 108, a doping amount of a nitrogen concentration is further increased so that the nitrogen concentration increases from a first concentration to a second concentration. In some embodiments, the first concentration is $2*10^{18}$ atoms/cm$^3$, and the second concentration is $3*10^{18}$ atoms/cm$^3$. In some embodiments, the first concentration is $2.2*10^{18}$ atoms/cm$^3$, and the second concentration is $2.9*10^{18}$ atoms/cm$^3$. In some embodiments, the first concentration is $2.5*10^{18}$ atoms/cm$^3$, and the second concentration is $2.8*10^{18}$ atoms/cm$^3$. In cases where the doping amount of the nitrogen concentration is controlled within the above range, the uniformity of resistivity of the formed silicon carbide crystal can be further optimized.

In the above embodiments, the nitrogen concentration can be increased in a linear fashion or in a stepwise fashion. For example, different doping adjustment methods of the nitrogen concentration are described with reference to FIG. 3A to FIG. 3D.

Figure 3A:
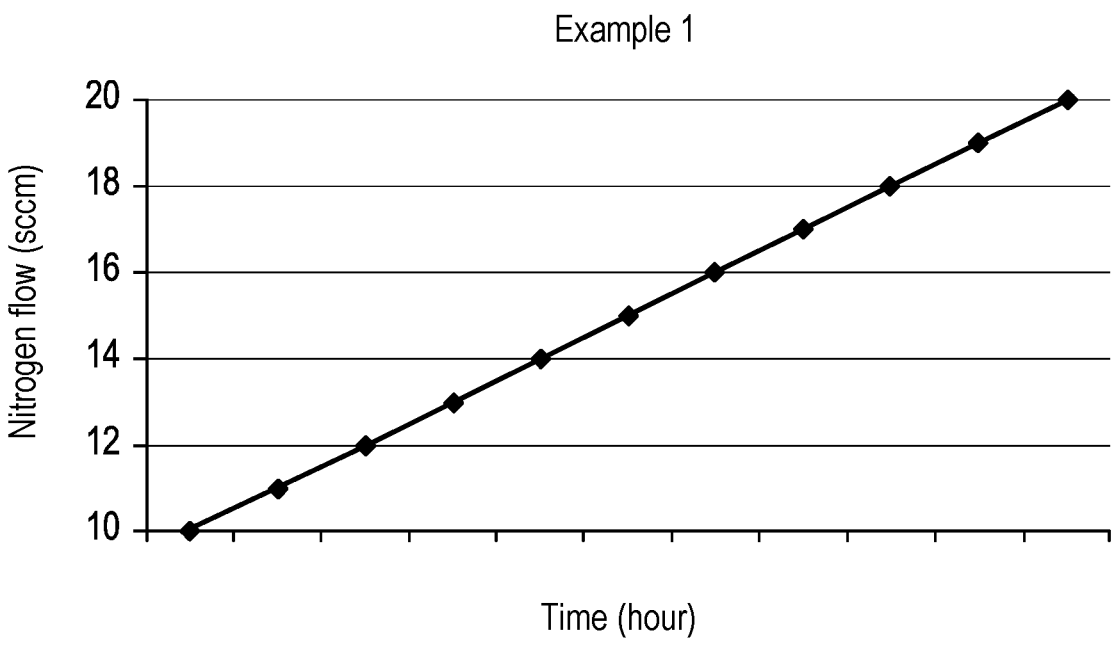
FIG. 3A to FIG. 3D are charts illustrating different doping adjustment methods for increasing nitrogen concentration in the method for growing silicon carbide crystals according to an embodiment of the present disclosure.
Figure 3B:
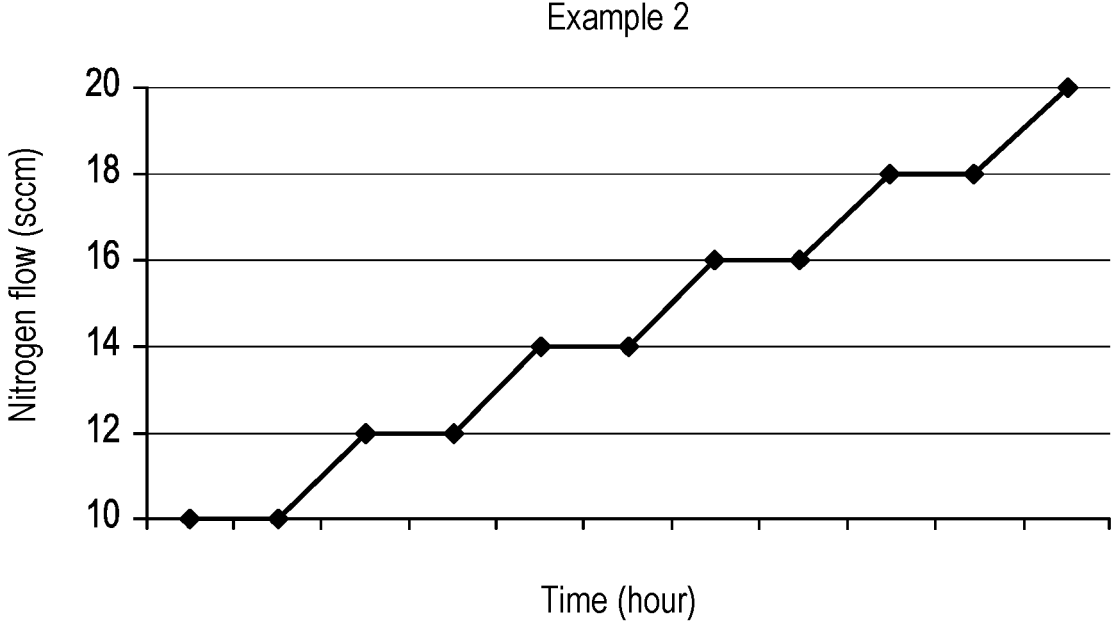
Figure 3C:
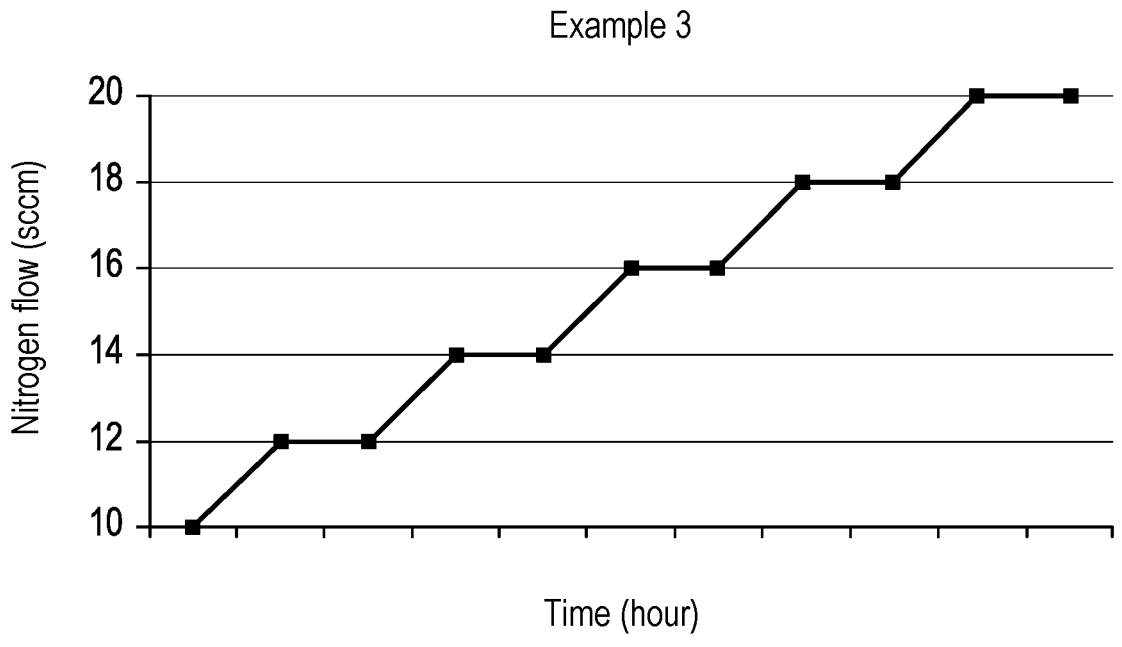
Figure 3D:
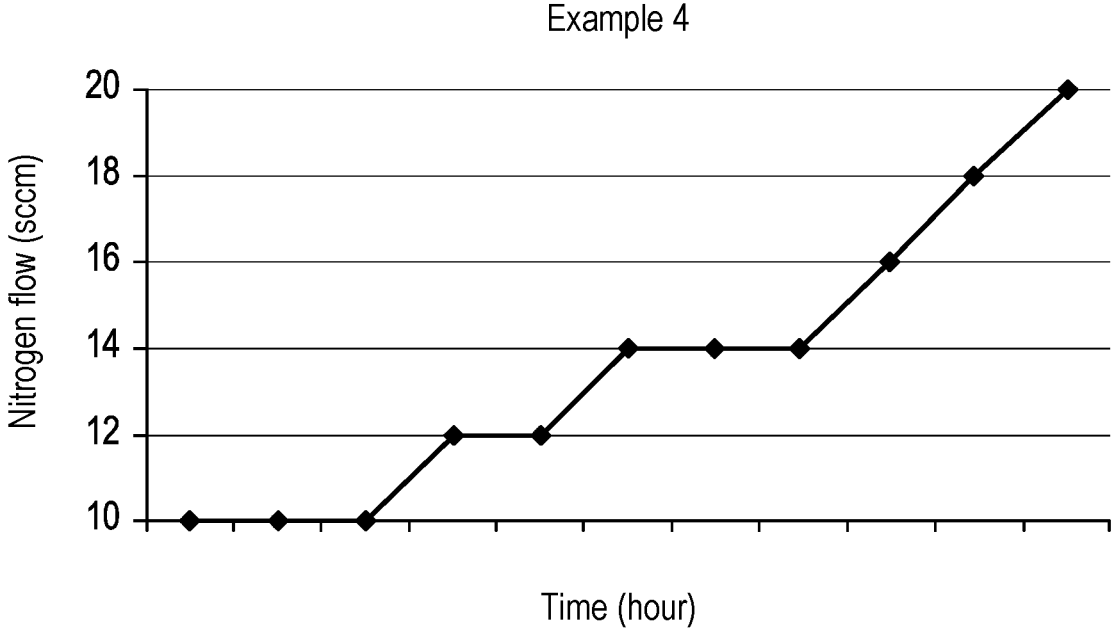

FIG. 3A to FIG. 3D are charts illustrating different doping adjustment methods for increasing nitrogen concentration in the method for growing silicon carbide crystals according to an embodiment of the present disclosure. As shown in FIG. 3A, in this embodiment, the flow rate of the nitrogen gas is increased linearly as compared with time, thus the nitrogen concentration is also increased in a linear fashion. As shown in FIG. 3B, in this embodiment, the flow rate of the nitrogen gas is increased in a stepwise fashion as compared with time, thus the nitrogen concentration is also increased in a stepwise fashion. As shown in FIG. 3C, in this embodiment, the flow rate of the nitrogen gas is increased stepwise as compared to time. However, in the embodiment of FIG. 3C, the flow rate of the nitrogen gas is increased directly at the start of the process, which is unlike the process shown in FIG. 3B whereby the flow rate of the nitrogen gas is stabilized at 10 sccm for a period of time before the concentration is increased in a stepwise fashion. As shown in FIG. 3D, in this embodiment, the flow rate of the nitrogen gas is increased stepwise as compared to the time. However, in the embodiment of FIG. 3D, the amount of the flow rate of the nitrogen gas increased in each stepwise process is different, and a residence time at specific nitrogen flow rates are also different.

In the embodiment of the present disclosure, increasing the doping amount of the nitrogen concentration is performed by increasing the flow rate of nitrogen gas in the reactor, so that the increase of the flow of nitrogen is controlled in the range of 10 sccm to 50 sccm, and the method shown in the above FIG. 3A to FIG. 3D can be used to increase the nitrogen concentration in a linear or stepwise fashion. In some embodiments, the increase of the nitrogen flow rate is controlled within the range of 10 sccm to 30 sccm.

In cases where the above method is used to form silicon carbide crystals, a monocrystalline proportion of the formed silicon carbide crystals and the silicon carbide wafers obtained after processing is 100%, and the resistivity of silicon carbide crystals/wafers is in a range of 15 mΩ·cm to 20 mΩ·cm, preferably within the range of 19 mΩ·cm to 20 mΩ·cm, and a deviation of an uniformity of the resistivity of the silicon carbide wafer is less than 0.4%. In some embodiments, the deviation of the uniformity of the resistivity of the silicon carbide wafer is less than 0.01%. In addition, in some embodiments, basal plane dislocations (BPD) of the silicon carbide crystals/wafers is less than 200/cm². In some embodiments, basal plane dislocations (BPD) of the silicon carbide crystals/wafers is less than 140/cm². In some embodiments, a bar stacking fault (BSF) of the silicon carbide crystals/wafers is less than 5/wafer. Accordingly, a silicon carbide crystal/wafer with a uniform resistivity distribution can be obtained, and a stress of the formed silicon carbide crystal/wafer is also lowered, and the geometry of the wafers after processing is also improved.

Figure 4:
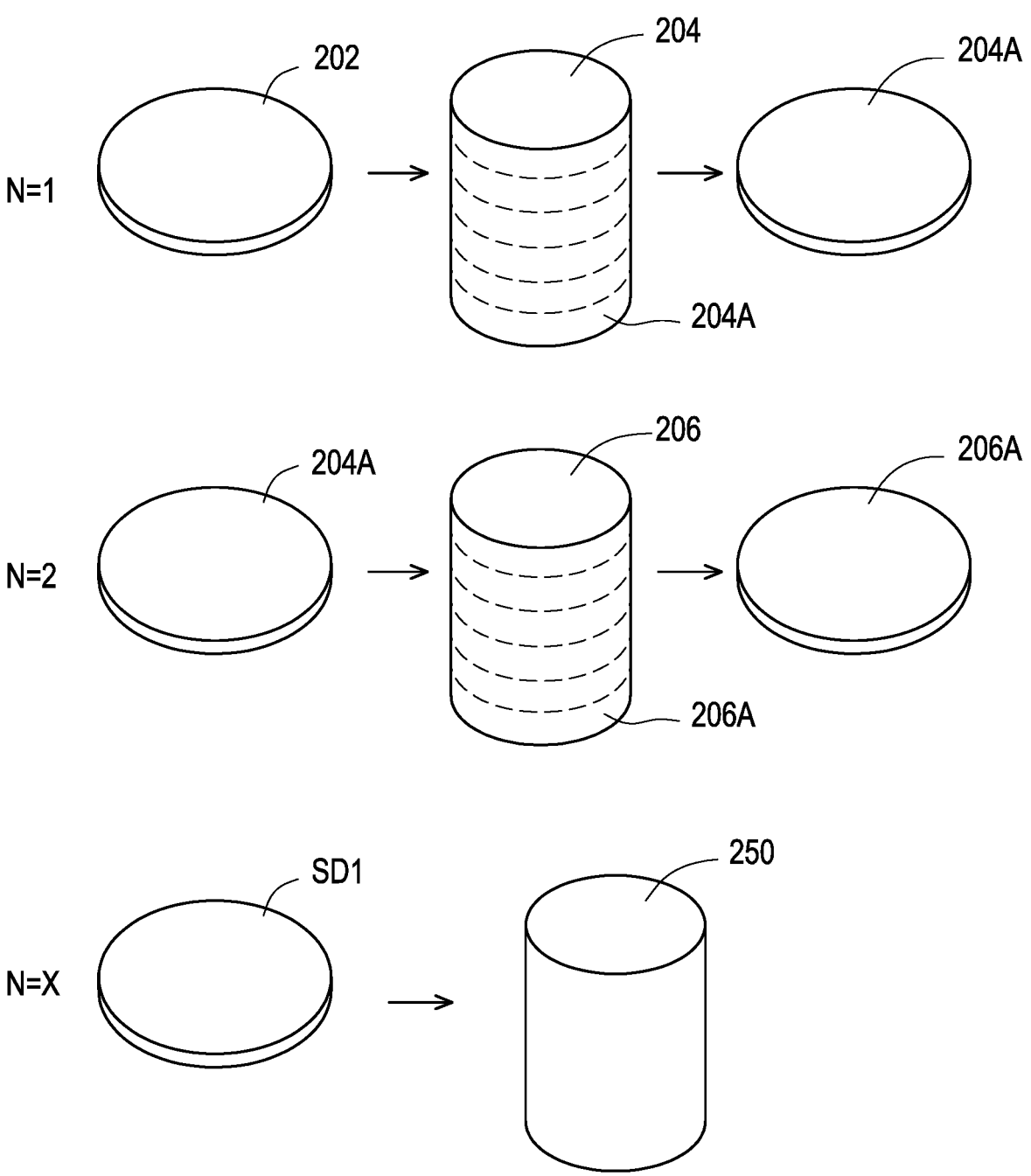
FIG. 4 is a schematic flowchart of a crystal growing method for crystals according to another embodiment of the present disclosure.

FIG. 4 is a schematic flowchart of a crystal growing method for crystals according to another embodiment of the present disclosure. In some embodiments, the above silicon carbide crystal growth method can be used to perform the crystal growing process. As shown in FIG. 4, in the crystal growing method of the embodiment of the present disclosure, a first crystal seed 202 is provided, wherein the first crystal seed 202 has a first monocrystalline proportion and a first size. In some embodiments, the first monocrystalline proportion is 70% to 80%, and the first size is 200 mm.

As shown in FIG. 4, a first crystal growth process (N=1) is performed using the first crystal seed 202 to obtain an intermediate crystal 204 with an increased monocrystalline proportion. When it is confirmed that the monocrystalline proportion of the intermediate crystal 204 is not 100%, the intermediate crystal 204 is sliced to obtain the growth crystal seed 204A. Subsequently, the previously obtained growth crystal seed 204A can be used as the crystal seed for the next crystal growing process. For example, in the second crystal growth process (N=2), the growth crystal seed 204A is used to perform the crystal growing process, so as to obtain the intermediate crystal 206 with an increased monocrystalline proportion. When it is confirmed that the monocrystalline proportion of the intermediate crystal 206 is not 100%, the intermediate crystal 206 is sliced to obtain the growth crystal seed 206A. Accordingly, the crystal growing process can be repeated several times (N=X) until the monocrystalline proportion of the intermediate crystal formed by the final crystal seed SD1 is 100%, whereby such intermediate crystal can be designated as the second crystal 250, which completes the crystal growing method in accordance with the embodiments of the present disclosure.

In the above-mentioned examples, the crystal growth process is performed for the first crystal seed 202 for N times, wherein each of the crystal growth processes will increase the first monocrystalline proportion, and the N times of crystal growth processes are performed until a second crystal 250 having a monocrystalline proportion of 100% is reached. In other words, when an intermediate crystal having a monocrystalline proportion of 100% is confirmed, the above crystal growth process is stopped to form the second crystal 250. In some embodiments, the N times includes more than 3 times of crystal growth processes. In some embodiments, the N times includes more than 3 times and less than 8 times of crystal growth processes. In some embodiments, the N times includes more than 4 times and less than 6 times of crystal growth processes.

Furthermore, in the above embodiments, each crystal growth process includes adjusting a ratio difference ($\Delta Tz/\Delta Tx$) between an axial temperature gradient ($\Delta Tz$) and a radial temperature gradient ($\Delta Tx$) of the crystal, so as to control the ratio difference within a range of 0.5 to 3. In the above embodiments, each crystal growth processes includes controlling a doping amount of a nitrogen concentration in a range of $2*10^{18}$ atom/cm³ to $3*10^{18}$ atom/cm³. In some embodiments, each of the crystal growth processes are different. For example, in the embodiments of the present disclosure, the ratio difference ($\Delta Tz/\Delta Tx$) between an axial temperature gradient ($\Delta Tz$) and a radial temperature gradient ($\Delta Tx$) for each of the crystal growth processes are different, and/or the doping amount of the nitrogen concentration are different, provided that the above ratio difference and the doping amount of the nitrogen concentration are still controlled in the above ranges. By using the above methods, it is possible to grow from a B-grade seed (low monocrystalline proportion) into an A-grade crystal (monocrystalline proportion being 100%) within a certain number of crystal growth processes. As such, it is possible to significantly shorten the time required for forming crystals having a high monocrystalline proportion and a large size.

Figure 5:
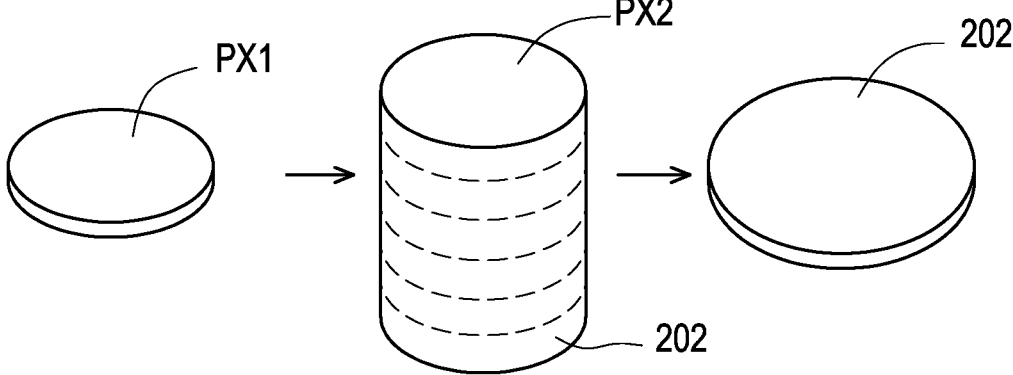
FIG. 5 is a schematic flow chart of preparing a first seed crystal used in the crystal growing method according to an embodiment of the present invention.

FIG. 5 is a schematic flow chart of preparing a first seed crystal used in the crystal growing method according to an embodiment of the present invention. In some embodiments, smaller-sized crystal seeds can also be used in expanding the diameter to form larger-sized crystals. As shown in FIG. 5, in some embodiments, a preliminary crystal seed PX1 is provided, wherein the preliminary crystal seed PX1 has a size A and a monocrystalline proportion of A'. In some embodiments, the size A is smaller than the first size of the first crystal seed 202, and the monocrystalline proportion A' is larger than the first monocrystalline proportion of the first crystal seed 202. For example, when the first crystal seed 202 has a first monocrystalline proportion of 70% to 80% and a first size of 200 mm, the single crystal ratio A' of the preliminary crystal seed PX1 is 100%, and the size A of the preliminary crystal seed PX1 is 150 mm.

As shown in FIG. 5, the preliminary crystal seed PX1 is used for performing a crystal growth process to obtain a first crystal PX2 having the above-mentioned first size and the above-mentioned first monocrystalline proportion. In the embodiment of the present disclosure, the crystal growth process of the preliminary crystal seed PX1 includes adjusting the ratio difference ($\Delta Tz/\Delta Tx$) between the axial temperature gradient ($\Delta Tz$) and the radial temperature gradient ($\Delta Tx$) of the crystal to control the ratio difference in the range of 0.5 to 3, and to control the doping amount of the nitrogen concentration in the range of $2*10^{18}$ atoms/cm³ to $3*10^{18}$ atoms/cm³. After the first crystal PX2 is obtained, the first crystal PX2 is sliced to obtain the above diameter-expanded first crystal seed 202, and the first crystal seed 202 can be used to perform the steps shown in FIG. 4 to obtain the second crystal 250 having a monocrystalline proportion of 100%. By using the above method, it is possible to grow and expand the diameter of an A-grade seed (monocrystalline proportion being 100%) to form an A-grade crystal (monocrystalline proportion being 100%) with a larger size within a certain number of crystal growth processes. As such, it is possible to significantly shorten the time required for forming crystals having a high monocrystalline proportion and a large size, thus the multiple expansion steps and years of expansion time required for traditional crystal size expansion can be avoided.

EXAMPLES

In order to prove that the method of the present invention can produce silicon carbide crystals with uniform resistivity, and can significantly shorten the time required for forming large-sized crystals with a high monocrystalline proportion, the following examples are performed and described.

First Example

In the first example, (i) the ratio difference ($\Delta Tz/\Delta Tx$) between the axial temperature gradient ($\Delta Tz$) and the radial temperature gradient ($\Delta Tx$), (ii) the doping variation method of the nitrogen concentration, and (iii) the doping amount of the nitrogen concentration of Examples 1 to 7 and Comparative Examples 1 to 4 are adjusted in the manner described in Table 1 and Table 2 below. Furthermore, the growth process is performed in the manner described in FIG. 1 and FIG. 2 to form silicon carbide crystals. The evaluation of the basal plane dislocations, monocrystalline proportion of the wafer, resistivity of the wafer, deviation of an uniformity of the resistivity of the wafer, and bar stacking-fault (BSF) of the obtained silicon carbide wafers are also shown in Table 1 and Table 2.

TABLE 1

| Item | Example 1 | Example 2 | Example 3 | Example 4 | Example 5 | Example 6 | Example 7 |
|---|---|---|---|---|---|---|---|
| (i) ratio difference ($\Delta Tz/\Delta Tx$) between the axial temperature gradient ($\Delta Tz$) and the radial temperature gradient ($\Delta Tx$) | 0.5 | 1 | 2 | 0.8 | 1.7 | 2.5 | 3 |
| (ii) doping variation method of the nitrogen concentration | From low to high (FIG. 3A) | From low to high (FIG. 3B) | From low to high (FIG. 3C) | From low to high (FIG. 3D) | From low to high (FIG. 3A) | From low to high (FIG. 3A) | From low to high (FIG. 3A) |
| (iii) doping amount of the nitrogen concentration (atom/cm$^3$) | Low: greater than $2 \times 10^{18}$ High: less than $3 \times 10^{18}$ | Low: greater than $2.1 \times 10^{18}$ High: less than $2.9 \times 10^{18}$ | Low: greater than $2.1 \times 10^{18}$ High: less than $2.9 \times 10^{18}$ | Low: greater than $2.2 \times 10^{18}$ High: less than $2.9 \times 10^{18}$ | Low: greater than $2.3 \times 10^{18}$ High: less than $2.8 \times 10^{18}$ | Low: greater than $2.4 \times 10^{18}$ High: less than $2.8 \times 10^{18}$ | Low: greater than $2.5 \times 10^{18}$ High: less than $2.8 \times 10^{18}$ |
| The obtained silicon carbide wafers: | | | | | | | |
| basal plane dislocations (BPD)(amount/cm$^2$) | Less than 199 | Less than 195 | Less than 187 | Less than 176 | Less than 164 | Less than 161 | Less than 145 |
| Monocrystalline proportion (%) | 100% | 100% | 100% | 100% | 100% | 100% | 100% |
| Resistivity (m$\Omega \cdot$ cm) | 15~20 | 15~20 | 18~20 | 18~20 | 18~20 | 19-20 | 19-20 |
| deviation of an uniformity of the resistivity (% dev) | <0.4% | <0.35% | <0.2% | <0.15% | <0.1% | <0.08% | <0.01% |
| Bar stacking fault (BSF) (ea/wafer) | 5 | 3 | 2 | 1 | 2 | 1 | 1 |

TABLE 2

| Item | Comparative Example 1 | Comparative Example 2 | Comparative Example 3 | Comparative Example 4 |
|---|---|---|---|---|
| (i) ratio difference ($\Delta Tz/\Delta Tx$) between the axial temperature gradient ($\Delta Tz$) and the radial temperature gradient ($\Delta Tx$) | 0.4 | 3 | 4 | 0.3 |
| (ii) doping variation method of the nitrogen concentration | Fixed concentration | Fixed concentration | From low to high | From low to high |

TABLE 2-continued

| Item | Comparative Example 1 | Comparative Example 2 | Comparative Example 3 | Comparative Example 4 |
|---|---|---|---|---|
| (iii) doping amount of the nitrogen concentration (atom/cm$^3$) | $1 \times 10^{18}$ | $4 \times 10^{18}$ | Low: greater than $1 \times 10^{18}$ High: less than $3 \times 10^{18}$ | Low: greater than $2 \times 10^{18}$ High: less than $3.5 \times 10^{18}$ |
| | | The obtained silicon carbide wafers: | | |
| basal plane dislocations (BPD)(amount/cm$^2$) | Greater than 1000 | Greater than 1500 | Greater than 2500 | Greater than 3000 |
| Monocrystalline proportion (%) | 100% | 100% | 100% | 100% |
| Resistivity (mΩ · cm) | 22~27 | 22~27 | 22~27 | 22~27 |
| deviation of an uniformity of the resistivity (% dev) | >5% | >4% | >2% | >1.5% |
| Bar stacking fault (BSF) (ea/wafer) | 32 | 27 | 16 | 10 |

From the experimental results of Examples 1 to 7 shown in Table 1 above, when the ratio difference (ΔTz/ΔTx) between the axial temperature gradient (ΔTz) and the radial temperature gradient (ΔTx) is controlled in the range of 0.5 to 3, and the doping variation method of the nitrogen concentration is adjusted from low concentration to high concentration, and when the doping amount of the nitrogen concentration is controlled in the range of $2*10^{18}$ atoms/cm$^3$ to $3*10^{18}$ atoms/cm$^3$, then the obtained silicon carbide crystal will have a monocrystalline proportion of 100%, and the silicon carbide wafer obtained after processing can have a uniform resistivity distribution (deviation of the uniformity of the resistivity is less than 0.4%), and the basal plane dislocations (BPD) of the wafer can be controlled below 200/cm$^2$, the bar stacking fault can be controlled to less than or equal to 5/wafer (ea/wf), and the wafer resistivity (15~20 mΩ·cm) are also within an ideal range, and preferably in the range of 19 mΩ·cm to 20 mΩ·cm.

Taking a step further, when the ratio difference (ΔTz/ΔTx) is controlled in the range of 2 to 3, and the doping amount of the nitrogen concentration is controlled in the range of $2.1*10^{18}$ atoms/cm$^3$ to $2.9*10^{18}$ atoms/cm$^3$, then the silicon carbide wafer obtained after processing the silicon carbide crystals has a better uniformity of the resistivity distribution, and less wafer defects and bar stacking faults can be observed. In addition, when the ratio difference (ΔTz/ΔTx) is controlled in the range of 2.5 to 3, and the doping amount of the nitrogen concentration is controlled in the range of $2.4*10^{18}$ atoms/cm$^3$ to $2.8*10^{18}$ atoms/cm$^3$, then the obtained silicon carbide wafer has the best uniformity of the resistivity distribution, and defects such as basal plane dislocations (BPD) and bar stacking faults (BSF) are least observed. Accordingly, the silicon carbide wafer obtained by processing the N-type silicon carbide crystals formed by the method of growing silicon carbide crystals according to the embodiments of the present disclosure can have a uniform resistivity distribution, and the crystal stress is low, and the geometry of the processed wafer will also be improved.

In comparison, from the experimental results shown in Table 2, referring to Comparative Example 1, when the ratio difference (ΔTz/ΔTx) is not controlled within the range of 0.5 to 3, and the doping method of the nitrogen concentration is not changed, while a fixed doping concentration of $1*10^{18}$ atoms/cm$^3$ is used, the uniformity of the resistivity distribution of the obtained silicon carbide wafer is not good (deviation of the uniformity >5%), and the basal plane dislocation (BPD) results are also not good. Referring to Comparative Example 2, even when the ratio difference (ΔTz/Δx) is controlled within the range of 0.5 to 3, if there is no doping variation in the nitrogen concentration whereby a fixed doping concentration is used, then the uniformity of the resistivity distribution of the obtained silicon carbide wafer is still not good (deviation of the uniformity >4%), and the defects such as basal plane dislocations (BPD) and bar stacking faults (BSF) results are also not good. Referring to Comparative Examples 3-4, although the doping of the nitrogen concentration is varied from a low concentration to a high concentration, if the ratio difference (ΔTz/Δx) is not controlled within the range of 0.5 to 3, and if the doping amount of the nitrogen concentration is not controlled within the range of $2*10^{18}$ atoms/cm$^3$ to $3*10^{18}$ atoms/cm$^3$, although the uniformity of the resistivity distribution is slightly improved compared with Comparative Examples 1-2 (deviation of the uniformity >1.5%), the uniformity of the resistivity distribution is still not within the ideal range, and the defects such as basal plane dislocations (BPD) and bar stacking faults (BSF) results are still not good.

Second Example

In the second example, (i) the ratio difference (ΔTz/ΔTx) between the axial temperature gradient (ΔTz) and the radial temperature gradient (ΔTx), (ii) the doping variation method of the nitrogen concentration, and (iii) the doping amount of the nitrogen concentration of the crystal growth process of Examples 8 to 11 and Comparative Examples 5 to 8 are adjusted in the manner described in Tables 3-10 below. In addition, the crystal growth process is performed using the first crystal seed in the manner described in FIG. 4 to form silicon carbide crystals. The evaluation of the basal plane dislocations (BPD), monocrystalline proportion, resistivity, deviation of an uniformity of the resistivity, and bar stacking-fault (BSF) of the obtained silicon carbide crystals in each of the crystal growth processes are also shown in Tables 3-10.

TABLE 3

| Item | Example 8 | | | | | |
|---|---|---|---|---|---|---|
| Crystal growth process | N = 1 | N = 2 | N = 3 | N = 4 | N = 5 | N = 6 |
| Monocrystalline proportion of crystal seed | 80% | >90% | >95% | >97% | >98% | >99% |
| Size of crystal seed (diameter) | 200 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 3 | 2.8 | 2.5 | 2 | 1.6 | 0.8 |
| (ii) doping variation method of the nitrogen concentration | Fixed concentration | Fixed concentration | From low to high | From low to high | From low to high | From low to high |
| (iii) doping amount of the concentration (atom/cm$^3$) | $3 \times 10^{18}$ | $2.9 \times 10^{18}$ | Low: greater than $2 \times 10^{18}$ High: less than $2.8 \times 10^{18}$ | Low: greater than $2.1 \times 10^{18}$ High: less than $2.7 \times 10^{18}$ | Low: greater than $2.2 \times 10^{18}$ High: less than $2.6 \times 10^{18}$ | Low: greater than $2.3 \times 10^{18}$ High: less than $2.6 \times 10^{18}$ |
| The obtained silicon carbide crystals and wafers | | | | | | |
| basal plane dislocations (BPD)(amount/cm$^2$) | Less than 200 | Less than 95 | Less than 186 | Less than 178 | Less than 163 | Less than 141 |
| Monocrystalline proportion (%) | >90% | >95% | >97% | >98% | >99% | 100% |
| Resistivity (m$\Omega \cdot$ cm) | 15~20 | 15~20 | 15~20 | 18~20 | 18~20 | 19~20 |
| deviation of an uniformity of the resistivity (% dev) | <0.4% | <0.3% | <0.2% | <0.1% | <0.07% | <0.01% |
| Bar stacking fault (BSF) (ea/wafer) | 5 | 3 | 2 | 2 | 2 | 1 |

TABLE 4

| Item | Example 9 | | | | | |
|---|---|---|---|---|---|---|
| Crystal growth process | N = 1 | N = 2 | N = 3 | N = 4 | N = 5 | N = 6 |
| Monocrystalline proportion of crystal seed | 80% | >90% | >95% | >97% | >98% | >99% |
| Size of crystal seed (diameter) | 200 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 2.9 | 2.5 | 2 | 1.8 | 1.2 | 0.5 |
| (ii) doping variation method of the nitrogen concentration | From high to low | From high to low | From high to low | From high to low | From high to low | From high to low |
| (iii) doping amount of the nitrogen concentration (atom/cm$^3$) | High: less than $3 \times 10^{18}$ Low: greater than $2.1 \times 10^{18}$ | High: less than $3 \times 10^{18}$ Low: greater than $2.2 \times 10^{18}$ | High: less than $3 \times 10^{18}$ Low: greater than $2.5 \times 10^{18}$ | High: less than $2.9 \times 10^{18}$ Low: greater than $2.5 \times 10^{18}$ | High: less than $2.8 \times 10^{18}$ Low: greater than $2.5 \times 10^{18}$ | High: less than $2.8 \times 10^{18}$ Low: greater than $2.6 \times 10^{18}$ |

TABLE 4-continued

| Item | Example 9 | | | | | |
|---|---|---|---|---|---|---|
| Crystal growth process | N = 1 | N = 2 | N = 3 | N = 4 | N = 5 | N = 6 |
| The obtained silicon carbide crystals and wafers | | | | | | |
| basal plane dislocations (BPD)(amount/cm$^2$) | Less than 197 | Less than 182 | Less than 174 | Less than 168 | Less than 155 | Less than 141 |
| Monocrystalline proportion (%) | >90% | >95% | >97% | >98% | >99% | 100% |
| Resistivity (mΩ · cm) | 15~20 | 15~20 | 18~20 | 18~20 | 19~20 | 19~20 |
| deviation of an uniformity of the resistivity (% dev) | <0.35% | <0.2% | <0.16% | <0.1% | <0.06% | <0.01% |
| Bar stacking fault (BSF) (ea/wafer) | 4 | 3 | 3 | 2 | 1 | 1 |

TABLE 5

| Item | Example 10 | | | | | |
|---|---|---|---|---|---|---|
| Crystal growth process | N = 1 | N = 2 | N = 3 | N = 4 | N = 5 | N = 6 |
| Monocrystalline proportion of crystal seed | 80% | >90% | >95% | >97% | >98% | >99% |
| Size of crystal seed (diameter) | 200 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 3 | 2.7 | 2.2 | 1.7 | 1.5 | 0.6 |
| (ii) doping variation method of the nitrogen concentration | Fixed concentration | Fixed concentration | From high to low | From high to low | From high to low | From high to low |
| (iii) doping amount of the nitrogen concentration (atom/cm$^3$) | $3 \times 10^{18}$ | $2.8 \times 10^{18}$ | High: less than $3 \times 10^{18}$ Low: greater than $2.2 \times 10^{18}$ | High: less than $2.9 \times 10^{18}$ Low: greater than $2.2 \times 10^{18}$ | High: less than $2.9 \times 10^{18}$ Low: greater than $2.5 \times 10^{18}$ | High: less than $2.8 \times 10^{18}$ Low: greater than $2.5 \times 10^{18}$ |
| The obtained silicon carbide crystals and wafers: | | | | | | |
| basal plane dislocations (BPD)(amount/cm$^2$) | Less than 199 | Less than 185 | Less than 178 | Less than 177 | Less than 164 | Less than 144 |
| Monocrystalline proportion (%) | >90% | >95% | >97% | >98% | >99% | 100% |
| Resistivity (mΩ · cm) | 15~20 | 15~20 | 18~20 | 18~20 | 19~20 | 19~20 |
| deviation of an uniformity of the resistivity (% dev) | <0.38% | <0.29% | <0.22% | <0.18% | <0.05% | <0.01% |
| Bar stacking fault (BSF) (ea/wafer) | 3 | 2 | 1 | 1 | 1 | 1 |

TABLE 6

| Item | Example 11 | | | | | |
|---|---|---|---|---|---|---|
| Crystal growth process | N = 1 | N = 2 | N = 3 | N = 4 | N = 5 | N = 6 |
| Monocrystalline proportion of crystal seed | 80% | >90% | >95% | >97% | >98% | >99% |
| Size of crystal seed (diameter) | 200 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 2.8 | 2.6 | 2 | 1.9 | 1.6 | 0.7 |
| (ii) doping variation method of the nitrogen concentration | From low to high | From low to high | From low to high | From low to high | From low to high | From low to high |
| (iii) doping amount of the nitrogen concentration (atom/cm$^3$) | Low: greater than $2 \times 10^{18}$ High: less than $3 \times 10^{18}$ | Low: greater than $2.1 \times 10^{18}$ High: less than $2.9 \times 10^{18}$ | Low: greater than $2.1 \times 10^{18}$ High: less than $2.8 \times 10^{18}$ | Low: greater than $2.2 \times 10^{18}$ High: less than $2.7 \times 10^{18}$ | Low: greater than $2.2 \times 10^{18}$ High: less than $2.6 \times 10^{18}$ | Low: greater than $2.3 \times 10^{18}$ High: less than $2.5 \times 10^{18}$ |
| The obtained silicon carbide crystals and wafers: | | | | | | |
| basal plane dislocations (BPD)(amount/cm$^2$) | Less than 198 | Less than 189 | Less than 177 | Less than 162 | Less than 155 | Less than 145 |
| Monocrystalline proportion (%) | >90% | >95% | >97% | >98% | >99% | 100% |
| Resistivity (mΩ · cm) | 15~20 | 15~20 | 18~20 | 18~20 | 19~20 | 19~20 |
| deviation of an uniformity of the resistivity (% dev) | <0.28% | <0.21% | <0.16% | <0.12% | <0.09% | <0.01% |
| Bar stacking fault (BSF) (ea/wafer) | 4 | 3 | 2 | 2 | 1 | 1 |

TABLE 7

| Item | Comparative Example 5 | | | | | | |
|---|---|---|---|---|---|---|---|
| Crystal growth process | N = 1 | N = 2 | N = 3 | N = 4 | N = 5 | N = 6 | N = 7 |
| Monocrystalline proportion of crystal seed | 80% | 82% | 82% | 85% | 87% | 87% | 88% |
| Size of crystal seed (diameter) | 200 mm | 200 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 10 | 9.5 | 9 | 8.5 | 8 | 7.5 | 7 |
| (ii) doping variation method of the nitrogen concentration | Fixed concentration | Fixed concentration | From low to high | From low to high | From low to high | From low to high | From low to high |
| (iii) doping amount of the nitrogen concentration (atom/cm$^3$) | $8 \times 10^{18}$ | $7 \times 10^{18}$ | Low: greater than $3.1 \times 10^{18}$ High: less than $7 \times 10^{18}$ | Low: greater than $3.1 \times 10^{18}$ High: less than $6.9 \times 10^{18}$ | Low: greater than $3.1 \times 10^{18}$ High: less than $6.8 \times 10^{18}$ | Low: greater than $3.1 \times 10^{18}$ High: less than $6.5 \times 10^{18}$ | Low: greater than $3.2 \times 10^{18}$ High: less than $6.5 \times 10^{18}$ |

TABLE 7-continued

| The obtained silicon carbide crystals and wafers: | | | | | | |
|---|---|---|---|---|---|---|
| basal plane dislocations (BPD)(amount/cm²) | Greater than 3000 | Greater than 2800 | Greater than 2600 | Greater than 2400 | Greater than 2250 | Greater than 2000 | Greater than 1880 |
| Monocrystalline proportion (%) | 82(%) | 82(%) | 85% | 87% | 87% | 88% | 88% |
| Resistivity (mΩ · cm) | 22~27 | 22~27 | 22~27 | 22~27 | 22~27 | 22~27 | 22~27 |
| deviation of an uniformity of the resistivity (% dev) | >5% | >4.5% | >4.4% | >4.3% | >3.8% | >3.7% | >3.8% |
| Bar stacking fault (BSF) (ea/wafer) | 35 | 32 | 36 | 31 | 38 | 22 | 27 |

| Item | Comparative Example 5 | | | | | |
|---|---|---|---|---|---|---|
| Crystal growth process | N = 8 | N = 9 | N = 10 | N = 11 | N = 12 | N = 13 |
| Monocrystalline proportion of crystal seed | 88% | 89% | 90% | 90% | 91% | 92% |
| Size of crystal seed (diameter) | 200 mm | 200 mm | 200 mm | 200 mm | 200 mm | 200 mm |
| (i) ratio difference (ΔTz/ΔTx) between the axial temperature gradient (ΔTz) and the radial temperature gradient (ΔTx) | 6.5 | 5.5 | 4 | 3 | 0.4 | 0.2 |
| (ii) doping variation method of the nitrogen concentration | From low to high | From low to high | From low to high | From low to high | From low to high | From low to high |
| (iii) doping amount of the nitrogen concentration (atom/cm³) | Low: greater than $3.5 \times 10^{18}$ High: less than $6.5 \times 10^{18}$ | Low: greater than $3.5 \times 10^{18}$ High: less than $6 \times 10^{18}$ | Low: greater than $3.6 \times 10^{18}$ High: less than $6 \times 10^{18}$ | Low: greater than $3.7 \times 10^{18}$ High: less than $6 \times 10^{18}$ | Low: greater than $3.7 \times 10^{18}$ High: less than $5.6 \times 10^{18}$ | Low: greater than $3.7 \times 10^{18}$ High: less than $5.5 \times 10^{18}$ |
| The obtained silicon carbide crystals and wafers: | | | | | | |
| basal plane dislocations (BPD)(amount/cm²) | Greater than 1600 | Greater than 1430 | Greater than 1200 | Greater than 1100 | Greater than 1100 | Greater than 1100 |
| Monocrystalline proportion (%) | 89% | 90% | 90% | 91% | 92% | 93% |
| Resistivity (mΩ · cm) | 22~27 | 22~27 | 22~27 | 22~27 | 22~27 | 22~27 |
| deviation of an uniformity of the resistivity (% dev) | >4.8% | >3.8% | >4.3% | >4.5% | >4.10% | >4% |
| Bar stacking fault (BSF) (ea/wafer) | 33 | 27 | 21 | 35 | 18 | 9 |

TABLE 8

| Item | Comparative Example 6 | | | | | |
|---|---|---|---|---|---|---|
| Crystal growth process | N = 1 | N = 2 | N = 3 | N = 4 | N = 5 | N = 6 |
| Monocrystalline proportion of crystal seed | 80% | 81% | 82% | 83% | 85% | 87% |
| Size of crystal seed (diameter) | 200 mm | 200 mm | 200 mm | 200 mm | 200 mm | 200 mm |
| (i) ratio difference (ΔTz/ΔTx) between the axial temperature gradient (ΔTz) and the radial temperature gradient (ΔTx) | 9.8 | 9.6 | 9 | 8.3 | 8 | 7.2 |

TABLE 8-continued

| (ii) doping variation method of the nitrogen concentration | From high to low | From high to low | From high to low | From high to low | From high to low | From high to low |
|---|---|---|---|---|---|---|
| (iii) doping amount of the nitrogen concentration (atom/cm³) | High: less than $8 \times 10^{18}$ Low: greater than $3.2 \times 10^{18}$ | High: less than $7.5 \times 10^{18}$ Low: greater than $3.1 \times 10^{18}$ | High: less than $7 \times 10^{18}$ Low: greater than $3.1 \times 10^{18}$ | High: less than $6.9 \times 10^{18}$ Low: greater than $3.2 \times 10^{18}$ | High: less than $6.8 \times 10^{18}$ Low: greater than $3.2 \times 10^{18}$ | High: less than $6.5 \times 10^{18}$ Low: greater than $3.2 \times 10^{18}$ |
| The obtained silicon carbide crystals and wafers: | | | | | | |
| basal plane dislocations (BPD)(amount/cm²) | Greater than 3000 | Greater than 2800 | Greater than 2500 | Greater than 2300 | Greater than 2250 | Greater than 2100 |
| Monocrystalline proportion (%) | 81% | 82% | 83% | 85% | 87% | 87% |
| Resistivity (mΩ · cm) | 22~27 | 22~27 | 22~27 | 22~27 | 22~27 | 22~27 |
| deviation of an uniformity of the resistivity (% dev) | >5% | >5% | >5% | >4.9% | >4.9% | >4.8% |
| Bar stacking fault (BSF) (ea/wafer) | 38 | 32 | 28 | 22 | 19 | 18 |

| Item | Comparative Example 6 | | | | | |
|---|---|---|---|---|---|---|
| Crystal growth process | N = 7 | N = 8 | N = 9 | N = 10 | N = 11 | N = 12 |
| Monocrystalline proportion of crystal seed | 87% | 88% | 89% | 90% | 90% | 90% |
| Size of crystal seed (diameter) | 200 mm | 200 mm | 200 mm | 200 mm | 200 mm | 200 mm |
| (i) ratio difference (ΔTz/ΔTx) between the axial temperature gradient (ΔTz) and the radial temperature gradient (ΔTx) | 6.5 | 5.5 | 4 | 3 | 0.4 | 0.2 |
| (ii) doping variation method of the nitrogen concentration | From high to low | From high to low | From high to low | From high to low | From high to low | From high to low |
| (iii) doping amount of the nitrogen concentration (atom/cm³) | High: less than $6.5 \times 10^{18}$ Low: greater than $3.2 \times 10^{18}$ | High: less than $6.5 \times 10^{18}$ Low: greater than $3.6 \times 10^{18}$ | High: less than $6 \times 10^{18}$ Low: greater than $3.6 \times 10^{18}$ | High: less than $5.8 \times 10^{18}$ Low: greater than $3.6 \times 10^{18}$ | High: less than $5.8 \times 10^{18}$ Low: greater than $3.7 \times 10^{18}$ | High: less than $5.7 \times 10^{18}$ Low: greater than $3.7 \times 10^{18}$ |
| The obtained silicon carbide crystals and wafers: | | | | | | |
| basal plane dislocations (BPD)(amount/cm²) | Greater than 1800 | Greater than 1650 | Greater than 1400 | Greater than 1250 | Greater than 1150 | Greater than 1100 |
| Monocrystalline proportion (%) | 88% | 89% | 90% | 90% | 90% | 91% |
| Resistivity (mΩ · cm) | 22~27 | 22~27 | 22~27 | 22~27 | 22~27 | 22~27 |
| deviation of an uniformity of the resistivity (% dev) | >4.5% | >4.5% | >4% | >4% | >4.1% | >4.10% |
| Bar stacking fault (BSF) (ea/wafer) | 22 | 18 | 19 | 20 | 22 | 23 |

TABLE 9

| Item | Comparative Example 7 | | | | | |
|---|---|---|---|---|---|---|
| Crystal growth process | N = 1 | N = 2 | N = 3 | N = 4 | N = 5 | N = 6 |
| Monocrystalline proportion of crystal seed | 80% | 82% | 82% | 83% | 85% | 86% |
| Size of crystal seed (diameter) | 200 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 9.8 | 9.4 | 9 | 8.5 | 8.3 | 7.8 |
| (ii) doping variation method of the nitrogen concentration | Fixed concentration | Fixed concentration | From high to low | From high to low | From high to low | From high to low |
| (iii) doping amount of the nitrogen concentration (atom/cm$^3$) | $7.5 \times 10^{18}$ | $7.5 \times 10^{18}$ | High: less than $7.2 \times 10^{18}$ Low: greater than $3.1 \times 10^{18}$ | High: less than $6.7 \times 10^{18}$ Low: greater than $3.2 \times 10^{18}$ | High: less than $6.7 \times 10^{18}$ Low: greater than $3.3 \times 10^{18}$ | High: less than $6.5 \times 10^{18}$ Low: greater than $3.3 \times 10^{18}$ |
| The obtained silicon carbide crystals and wafers: | | | | | | |
| basal plane dislocations (BPD)(amount/cm$^2$) | Greater than 3000 | Greater than 2900 | Greater than 2650 | Greater than 2350 | Greater than 2250 | Greater than 2100 |
| Monocrystalline proportion (%) | 82% | 82% | 83% | 85% | 86% | 87% |
| Resistivity (m$\Omega \cdot$ cm) | 22~27 | 22~27 | 22~27 | 22~27 | 22~27 | 22~27 |
| deviation of an uniformity of the resistivity (% dev) | >4.8% | >4.8% | >4.8% | >4.9% | >4.9% | >4.8% |
| Bar stacking fault (BSF) (ea/wafer) | 39 | 37 | 32 | 27 | 25 | 28 |

| Item | Comparative Example 7 | | | | | |
|---|---|---|---|---|---|---|
| Crystal growth process | N = 7 | N = 8 | N = 9 | N = 10 | N = 11 | N = 12 |
| Monocrystalline proportion of crystal seed | 87% | 88% | 89% | 90% | 90% | 90% |
| Size of crystal seed (diameter) | 200 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 6.8 | 5.5 | 5 | 4.8 | 4 | 3.2 |
| (ii) doping variation method of the nitrogen concentration | From high to low | From high to low | From high to low | From high to low | From high to low | From high to low |
| (iii) doping amount of the nitrogen concentration (atom/cm$^3$) | High: less than $6.5 \times 10^{18}$ Low: greater than $3.4 \times 10^{18}$ | High: less than $6.5 \times 10^{18}$ Low: greater than $3.6 \times 10^{18}$ | High: less than $6 \times 10^{18}$ Low: greater than $3.6 \times 10^{18}$ | High: less than $5.9 \times 10^{18}$ Low: greater than $3.6 \times 10^{18}$ | High: less than $5.8 \times 10^{18}$ Low: greater than $3.7 \times 10^{18}$ | High: less than $5.7 \times 10^{18}$ Low: greater than $3.9 \times 10^{18}$ |
| The obtained silicon carbide crystals and wafers: | | | | | | |
| basal plane dislocations (BPD)(amount/cm$^2$) | Greater than 1800 | Greater than 1550 | Greater than 1400 | Greater than 1250 | Greater than 1150 | Greater than 1100 |
| Monocrystalline proportion (%) | 88% | 89% | 90% | 90% | 90% | 91% |
| Resistivity (m$\Omega \cdot$ cm) | 22~27 | 22~27 | 22~27 | 22~27 | 22~27 | 22~27 |

TABLE 9-continued

| | | | | | | |
|---|---|---|---|---|---|---|
| deviation of an uniformity of the resistivity (% dev) | >4.5% | >4.5% | >4.3% | >4.3% | >4.0% | >4.0% |
| Bar stacking fault (BSF) (ea/wafer) | 26 | 24 | 19 | 16 | 20 | 16 |

TABLE 10

| Item | Comparative Example 8 | | | | | |
|---|---|---|---|---|---|---|
| Crystal growth process | N = 1 | N = 2 | N = 3 | N = 4 | N = 5 | N = 6 |
| Monocrystalline proportion of crystal seed | 81% | 83% | 85% | 86% | 86% | 87% |
| Size of crystal seed (diameter) | 200 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 9.3 | 8 | 7.8 | 7 | 6.8 | 6.5 |
| (ii) doping variation method of the nitrogen concentration | From low to high | From low to high | From low to high | From low to high | From low to high | From low to high |
| (iii) doping amount of the nitrogen concentration (atom/cm$^3$) | Low: greater than $3 \times 10^{18}$ High: less than $7 \times 10^{18}$ | Low: greater than $3 \times 10^{18}$ High: less than $6.8 \times 10^{18}$ | Low: greater than $3 \times 10^{18}$ High: less than $6.8 \times 10^{18}$ | Low: greater than $3 \times 10^{18}$ High: less than $6.6 \times 10^{18}$ | Low: greater than $3.1 \times 10^{18}$ High: less than $6.5 \times 10^{18}$ | Low: greater than $3.4 \times 10^{18}$ High: less than $6.5 \times 10^{18}$ |
| The obtained silicon carbide crystals and wafers: | | | | | | |
| basal plane dislocations (BPD)(amount/cm$^2$) | Greater than 2500 | Greater than 2300 | Greater than 2250 | Greater than 2000 | Greater than 1800 | Greater than 1500 |
| Monocrystalline proportion (%) | 82% | 84% | 85% | 86% | 86% | 89% |
| Resistivity (m$\Omega \cdot$ cm) | 22~27 | 22~27 | 22~27 | 22~27 | 22~27 | 22~27 |
| deviation of an uniformity of the resistivity (% dev) | >5% | >4.5% | >4% | >3.8% | >3.7% | >4.2% |
| Bar stacking fault (BSF) (ea/wafer) | 39 | 38 | 27 | 23 | 27 | 25 |

| Item | Comparative Example 8 | | | | |
|---|---|---|---|---|---|
| Crystal growth process | N = 7 | N = 8 | N = 9 | N = 10 | N = 11 |
| Monocrystalline proportion of crystal seed | 89% | 90% | 90% | 92% | 92% |
| Size of crystal seed (diameter) | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 5.8 | 5 | 4.4 | 3.8 | 3.5 |
| (ii) doping variation method of the nitrogen concentration | From low to high | From low to high | From low to high | From low to high | From low to high |

TABLE 10-continued

| (iii) doping amount of the nitrogen concentration (atom/cm³) | Low: greater than $3.4 \times 10^{18}$ High: less than $6 \times 10^{18}$ | Low: greater than $3.5 \times 10^{18}$ High: less than $6 \times 10^{18}$ | Low: greater than $3.6 \times 10^{18}$ High: less than $6 \times 10^{18}$ | Low: greater than $3.7 \times 10^{18}$ High: less than $5.6 \times 10^{18}$ | Low: greater than $3.71 \times 10^{18}$ High: less than $5.4 \times 10^{18}$ |
|---|---|---|---|---|---|
| | The obtained silicon carbide crystals and wafers: | | | | |
| basal plane dislocations (BPD)(amount/cm²) | Greater than 1400 | Greater than 1250 | Greater than 1150 | Greater than 1100 | Greater than 1050 |
| Monocrystalline proportion (%) | 90% | 90% | 91% | 92% | 93% |
| Resistivity (mΩ · cm) | 22~27 | 22~27 | 22~27 | 22~27 | 22~27 |
| deviation of an uniformity of the resistivity (% dev) | >3.8% | >4.3% | >4.2% | >4.10% | >4.2% |
| Bar stacking fault (BSF) (ea/wafer) | 25 | 15 | 18 | 14 | 14 |

As can be seen from the experimental results of Examples 8-11 shown in Tables 3-6 above, when the ratio difference ($\Delta Tz/\Delta Tx$) is controlled within the range of 0.5 to 3, and the doping amount of the nitrogen concentration is controlled within the range of $2*10^{18}$ atoms/cm³ to $3*10^{18}$ atoms/cm³, then no matter how the doping method of the nitrogen concentration is varied, a B-grade crystal seed (poor monocrystalline proportion) can be grown into an A-grade crystal (monocrystalline proportion of 100%) within 6 times (N=6) of the crystal growth process, and the basal plane dislocations (BPD), the resistivity, the uniformity of the resistivity and bar stacking faults (BSF) can all be controlled within an ideal range, for example, the BSF is less than or equal to 5/wafer.

In comparison, as can be seen from the experimental results of Comparative Examples shown in Tables 7-10 above, if the ratio difference ($\Delta Tz/\Delta Tx$) between the axial temperature gradient ($\Delta Tz$) and the radial temperature gradient ($\Delta Tx$) in each crystal growth process is not within the above range, and the doping amount of the nitrogen concentration is outside the above range, then even if the crystal growth process has been carried out for 11 to 13 times, it is still impossible to make the B-grade crystal seed (poor monocrystalline proportion) to grow to form crystals having a monocrystalline proportion of 100%, and the basal plane dislocations (BPD), uniformity of resistivity and bar stacking fault results are still poor. Accordingly, it can be understood that the crystal growth method of the embodiment of the present disclosure can significantly shorten the time required for forming crystals having a high monocrystalline proportion and a large size.

Third Example

In the third example, (i) the ratio difference ($\Delta Tz/\Delta Tx$) between the axial temperature gradient ($\Delta Tz$) and the radial temperature gradient ($\Delta Tx$), (ii) the doping variation method of the nitrogen concentration, and (iii) the doping amount of the nitrogen concentration of the crystal growth process of Example 12 and Comparative Example 9 are adjusted in the manner described in Tables 11~12 below. In addition, the method as shown in FIG. 5 is performed, whereby a smaller-sized crystal seed is used in a preliminary step (N=0) to expand its diameter to form a larger-sized crystal, and after slicing to form the first crystal seed, the method shown in FIG. 4 is performed by using the first crystal seed to perform the crystal growth process for forming silicon carbide crystals. The evaluation of the basal plane dislocations (BPD), monocrystalline proportion, resistivity, deviation of an uniformity of the resistivity, and bar stacking-fault (BSF) of the obtained silicon carbide crystals in each of the crystal growth processes are also shown in Tables 11~12.

TABLE 11

| Item | Comparative Example 12 | | | | |
|---|---|---|---|---|---|
| Crystal growth process | (N = 0) | N = 1 | N = 2 | N = 3 | N = 4 |
| Monocrystalline proportion of crystal seed | 100% | 80% | 85% | 90% | 95% |
| Size of crystal seed (diameter) | 150 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 3 | 2.8 | 2.5 | 2 | 1.2 |
| (ii) doping variation method of the nitrogen concentration | From low to high | Fixed concentration | Fixed concentration | From low to high | From low to high |

TABLE 11-continued

| Item | Comparative Example 12 | | | | |
|---|---|---|---|---|---|
| (iii) doping amount of the nitrogen concentration (atom/cm$^3$) | Low: greater than $2 \times 10^{18}$ High: less than $3 \times 10^{18}$ | $2.8 \times 10^{18}$ | $2.7 \times 10^{18}$ | Low: greater than $2.1 \times 10^{18}$ High: less than $3 \times 10^{18}$ | Low: greater than $2.2 \times 10^{18}$ High: less than $3 \times 10^{18}$ |
| | The obtained silicon carbide crystals and wafers: | | | | |
| basal plane dislocations (BPD)(amount/cm$^2$) | Less than 197 | Less than 186 | Less than 173 | Less than 162 | Less than 144 |
| Monocrystalline proportion (%) | 80% | 85% | 90% | 95% | 100% |
| Resistivity (mΩ · cm) | 15~20 | 15~20 | 18~20 | 18~20 | 19~20 |
| deviation of an uniformity of the resistivity (% dev) | <0.3% | <0.1% | <0.08% | <0.02% | <0.015% |
| Bar stacking fault (BSF) (ea/wafer) | 200 mm | 200 mm | 200 mm | 200 mm | 200 mm |
| basal plane dislocations (BPD)(amount/cm$^2$) | 5 | 4 | 4 | 3 | 1 |

TABLE 12

| Item | Comparative Example 9 | | | | | |
|---|---|---|---|---|---|---|
| Crystal growth process | N = 0 | N = 1 | N = 2 | N = 3 | N = 4 | N = 5 |
| Monocrystalline proportion of crystal seed | 100% | 70% | 71% | 71% | 72% | 73% |
| Size of crystal seed (diameter) | 150 mm | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 8 | 7.5 | 6.8 | 6 | 5.8 | 5.05 |
| (ii) doping variation method of the nitrogen concentration | From low to high | Fixed concentration | Fixed concentration | From low to high | From low to high | From low to high |
| (iii) doping amount of the nitrogen concentration (atom/cm$^3$) | Low: greater than $3.5 \times 10^{18}$ High: less than $8 \times 10^{18}$ | $4 \times 10^{18}$ | $5 \times 10^{18}$ | Low: greater than $5.2 \times 10^{18}$ High: less than $8 \times 10^{18}$ | Low: greater than $5.6 \times 10^{18}$ High: less than $8 \times 10^{18}$ | Low: greater than $5.8 \times 10^{18}$ High: less than $8 \times 10^{19}$ |
| | The obtained silicon carbide crystals and wafers: | | | | | |
| basal plane dislocations (BPD)(amount/cm$^2$) | Less than 3500 | Less than 3200 | Less than 2800 | Less than 2000 | Less than 1800 | Less than 1500 |
| Monocrystalline proportion (%) | 70% | 71% | 71% | 72% | 73% | 74% |
| Resistivity (mΩ · cm) | 22~27 | 22~27 | 22~27 | 22~27 | 22~27 | 22~27 |
| deviation of an uniformity of the resistivity (% dev) | <5% | <4.9% | <4.5% | <4.2% | <4% | <3.5% |
| Bar stacking fault (BSF) (ea/wafer) | 200 mm | 200 mm | 200 mm | 200 mm | 200 mm | 200 mm |
| basal plane dislocations (BPD)(amount/cm$^2$) | 34 | 30 | 10 | 9 | 7 | 7 |

TABLE 12-continued

| Item | Comparative Example 9 | | | | |
|---|---|---|---|---|---|
| Crystal growth process | N = 6 | N = 7 | N = 8 | N = 9 | N = 10 |
| Monocrystalline proportion of crystal seed | 74% | 75% | 76% | 77% | 78% |
| Size of crystal seed (diameter) | 200 mm | 200 mm | 200 mm | 200 mm | 200 mm |
| (i) ratio difference ($\Delta Tz/\Delta Tx$) between the axial temperature gradient ($\Delta Tz$) and the radial temperature gradient ($\Delta Tx$) | 4.46 | 3.87 | 3.28 | 3.2 | 3.1 |
| (ii) doping variation method of the nitrogen concentration | From low to high | From low to high | From low to high | From low to high | From low to high |
| (iii) doping amount of the nitrogen concentration (atom/cm$^3$) | Low: greater than $6 \times 10^{18}$ High: less than $8 \times 10^{19}$ | Low: greater than $6.2 \times 10^{18}$ High: less than $8 \times 10^{20}$ | Low: greater than $6.5 \times 10^{18}$ High: less than $8 \times 10^{20}$ | Low: greater than $6.5 \times 10^{18}$ High: less than $7.8 \times 10^{21}$ | Low: greater than $6.6 \times 10^{18}$ High: less than $7.5 \times 10^{21}$ |
| The obtained silicon carbide crystals and wafers: | | | | | |
| basal plane dislocations (BPD)(amount/cm$^2$) | Less than 1200 | Less than 1100 | Less than 1000 | Less than 900 | Less than 850 |
| Monocrystalline proportion (%) | 75% | 76% | 77% | 78% | 79% |
| Resistivity (m$\Omega \cdot$ cm) | 15~25 | 15~25 | 15~25 | 15~25 | 15~25 |
| deviation of an uniformity of the resistivity (% dev) | <3.2% | <3% | <2.8% | <2.8% | <2.5% |
| Bar stacking fault (BSF) (ea/wafer) | 200 mm | 200 mm | 200 mm | 200 mm | 200 mm |
| basal plane dislocations (BPD)(amount/cm$^2$) | 13 | 14 | 6 | 7 | 6 |

As can be seen from the experimental results of Example 12 shown in Table 11 above, when a smaller-sized A-grade preliminary seed (monocrystalline proportion of 100%) is further used for diameter expansion to form the first crystal seed, and the ratio difference ($\Delta Tz/\Delta Tx$) between the axial temperature gradient ($\Delta Tz$) and the radial temperature gradient ($\Delta Tx$) of each crystal growth process is controlled within the range of 0.5 to 3, and the doping amount of the nitrogen concentration is controlled within the range of $2*10^{18}$ atoms/cm$^3$ to $3*10^{18}$ atoms/cm$^3$, then no matter how the doping method of the nitrogen concentration is varied, the smaller-sized A grade crystal seed (monocrystalline proportion of 100%) can be grown into a diameter-expanded large size A-grade crystal (monocrystalline proportion of 100%) within 1 time of preliminary diameter expansion and 4 times (N=4) of the crystal growth process, and the basal plane dislocations (BPD), the resistivity, the uniformity of the resistivity and bar stacking faults (BSF) can all be controlled within an ideal range, for example, the BSF is less than or equal to 5/wafer.

In comparison, as can be seen from the experimental results of Comparative Example 9 shown in Table 12 above, if the ratio difference ($\Delta Tz/\Delta Tx$) between the axial temperature gradient ($\Delta Tz$) and the radial temperature gradient ($\Delta Tx$) in each crystal growth process is not within the above range, and the doping amount of the nitrogen concentration is outside the above range, then even if one time of preliminary diameter expansion and 10 times of the crystal growth process has been performed, it is still impossible to make the small-sized A-grade crystal seed (monocrystalline proportion of 100%) to grow to form larger size crystals having a monocrystalline proportion of 100%, and the basal plane dislocations (BPD), uniformity of resistivity and bar stacking fault results are still poor. Accordingly, it can be understood that the crystal growth method of the embodiment of the present disclosure can significantly shorten the time required for forming crystals having a high monocrystalline proportion and a large size, thus the multiple expansion steps and years of expansion time required for traditional crystal size expansion can be avoided.

In summary, the N-type silicon carbide crystals formed by the method of growing silicon carbide crystals of the embodiment of the present disclosure can have a uniform resistivity distribution. Accordingly, the crystal stress of the formed silicon carbide crystals is also lowered, and the geometry of the processed wafer is also improved. In addition, through the crystal growth method of the embodiment of the present disclosure, the time to form a large-sized crystal with a high monocrystalline proportion can be greatly shortened, and crystals having expanded diameter and/or with 100% monocrystalline proportion can be achieved within a certain number of crystal growth processes.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A silicon carbide crystal, wherein a monocrystalline proportion of the silicon carbide crystal is 100%, a resistivity of the silicon carbide crystal is in a range of 15 mΩ·cm to 20 mΩ·cm, and a deviation of an uniformity of the resistivity of the silicon carbide crystal is less than 0.4%.

2. The silicon carbide crystal according to claim 1, wherein the monocrystalline proportion of the silicon carbide crystal is 100%, a resistivity of the silicon carbide crystal is in a range of 19 mΩ·cm to 20 m Ω·cm, and a deviation of an uniformity of the resistivity of the silicon carbide crystal is less than 0.4%.

3. The silicon carbide crystal according to claim 1, wherein the deviation of the uniformity of the resistivity is less than 0.01%.

4. The silicon carbide crystal according to claim 1, wherein basal plane dislocations (BPD) of the silicon carbide crystal is less than 200/cm$^2$.

5. The silicon carbide crystal according to claim 4, wherein basal plane dislocations (BPD) of the silicon carbide crystal is less than 140/cm$^2$.

6. The silicon carbide crystal according to claim 1, wherein a bar stacking fault (BSF) of the silicon carbide crystal is less than 5/wafer.

7. A silicon carbide wafer, wherein a monocrystalline proportion of the silicon carbide wafer is 100%, a resistivity of the silicon carbide wafer is in a range of 15 mΩ·cm to 20 mΩ·cm, and a deviation of an uniformity of the resistivity of the silicon carbide wafer is less than 0.4%.

8. The silicon carbide wafer according to claim 7, wherein the monocrystalline proportion of the silicon carbide wafer is 100%, a resistivity of the silicon carbide wafer is in a range of 19 mΩ·cm to 20 mΩ·cm, and a deviation of an uniformity of the resistivity of the silicon carbide wafer is less than 0.4%.

9. The silicon carbide wafer according to claim 7, wherein the deviation of the uniformity of the resistivity is less than 0.01%.

10. The silicon carbide wafer according to claim 7, wherein basal plane dislocations (BPD) of the silicon carbide wafer is less than 200/cm$^2$.

11. The silicon carbide wafer according to claim 10, wherein basal plane dislocations (BPD) of the silicon carbide wafer is less than 140/cm$^2$.

12. The silicon carbide wafer according to claim 7, wherein a bar stacking fault (BSF) of the silicon carbide wafer is less than 5/wafer.

* * * * *